(12) United States Patent
Sinha

(10) Patent No.: US 8,951,354 B2
(45) Date of Patent: Feb. 10, 2015

(54) MEGASONIC CLEANING WITH CONTROLLED BOUNDARY LAYER THICKNESS AND ASSOCIATED SYSTEMS AND METHODS

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/430,376

(22) Filed: Mar. 26, 2012

(65) Prior Publication Data

US 2012/0174943 A1   Jul. 12, 2012

Related U.S. Application Data

(62) Division of application No. 12/944,527, filed on Nov. 11, 2010, now Pat. No. 8,156,950, which is a division of application No. 11/971,313, filed on Jan. 9, 2008, now abandoned.

(51) Int. Cl.
*B08B 3/12* (2006.01)
*H01L 21/67* (2006.01)

(52) U.S. Cl.
CPC ............ *B08B 3/12* (2013.01); *H01L 21/67057* (2013.01)
USPC .......................................................... 134/1.3

(58) Field of Classification Search
USPC ....................................................... 134/1.3
See application file for complete search history.

(56) References Cited

U.S. PATENT DOCUMENTS

| 5,383,484 A | 1/1995 | Thomas et al. |
| 5,834,871 A | 11/1998 | Puskas |
| 6,276,370 B1 | 8/2001 | Fisch et al. |
| 6,730,176 B2 | 5/2004 | Kuyel |
| 7,021,319 B2 | 4/2006 | Verhaverbeke et al. |

(Continued)

FOREIGN PATENT DOCUMENTS

| KR | 20040047482 A | 6/2004 |
| KR | 10-2004-0047482 | * 10/2004 |

OTHER PUBLICATIONS

Busnaina, A.A. and Glenn W. Gale, "Ultrasonic and Megasonic Particle Removal," Precision Cleaning Proceedings, 1995, pp. 347-360.

(Continued)

*Primary Examiner* — Michael Barr
*Assistant Examiner* — Jason Riggleman
(74) *Attorney, Agent, or Firm* — Perkins Coie LLP

(57) ABSTRACT

Megasonic cleaning systems and methods of using megasonic pressure waves to impart cavitation energy proximate a surface of a microelectronic substrate are disclosed herein. In one embodiment, a megasonic cleaning system includes a process tank for containing a liquid, a support element for carrying a substrate submerged in the liquid, and first and second transducers positioned in the tank. The first transducer is further positioned and/or operated to initiate cavitation events in a bulk portion of the liquid proximate a surface of the substrate. The second transducer is further positioned and/or operated to control an interface of fluid friction between the substrate and the bulk portion of the liquid.

10 Claims, 3 Drawing Sheets

(56) References Cited

U.S. PATENT DOCUMENTS

| | | |
|---|---|---|
| 7,238,085 B2 | 7/2007 | Montierth et al. |
| 2001/0013355 A1 | 8/2001 | Busnaina |
| 2004/0163682 A1 | 8/2004 | Boyd et al. |
| 2006/0180172 A1 | 8/2006 | Kundalgurki |
| 2006/0278253 A1 | 12/2006 | Verhaverbeke et al. |
| 2007/0006892 A1 | 1/2007 | Olesen et al. |
| 2007/0026602 A1* | 2/2007 | Mimken ............... 438/243 |
| 2007/0182285 A1 | 8/2007 | Goodson |
| 2007/0215172 A1 | 9/2007 | Watanabe et al. |
| 2008/0142055 A1* | 6/2008 | Yin et al. .............. 134/95.1 |
| 2009/0173358 A1 | 7/2009 | Sinha |
| 2011/0048475 A1 | 3/2011 | Sinha |

OTHER PUBLICATIONS

Holsteyns, F. et al., "Megasonics: a cavitation driven process," Solid State Phenomena, vols. 103-104, pp. 159-162, 2005, Trans Tech Publications Ltd., Switzerland.

International Search Report and Written Opinion issued Mar. 13, 2009 in International Application No. PCT/US2008/086623.

Office Action issued Jun. 26, 2012 in Taiwan Application No. 098100211, 16 pages.

Office Action issued Apr. 24, 2013 in Taiwan Application No. 098100211, 21 pages.

* cited by examiner

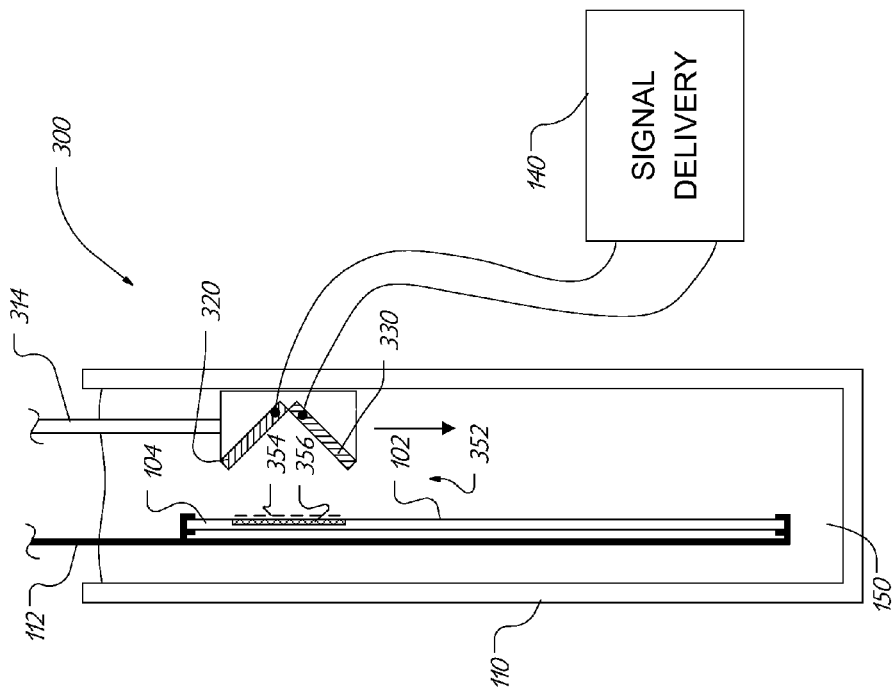
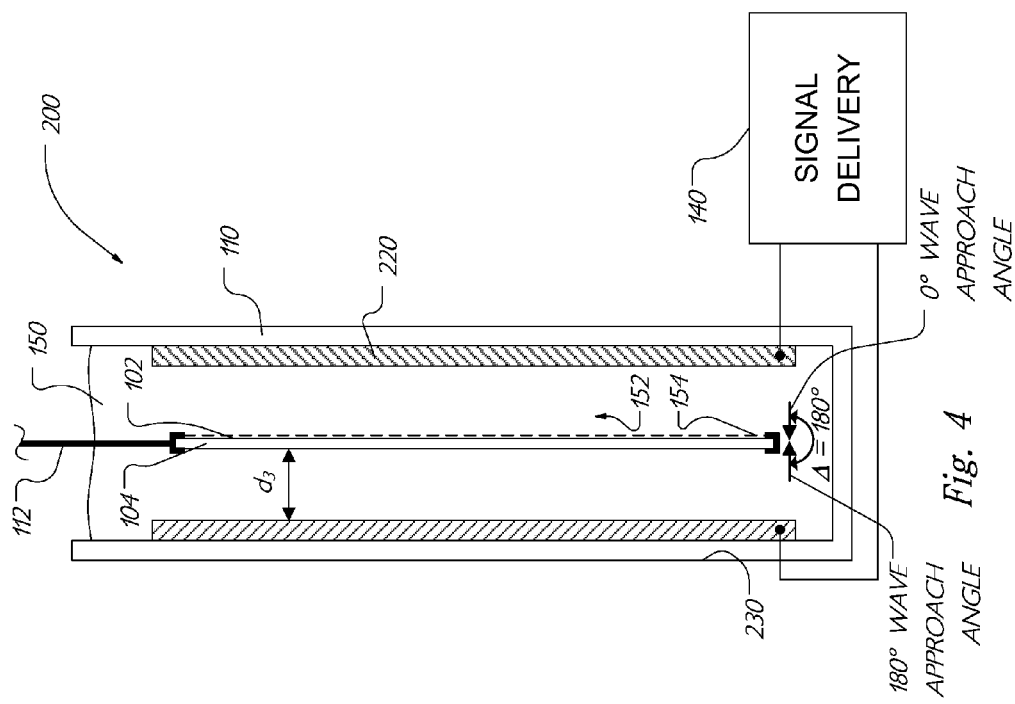

US 8,951,354 B2

MEGASONIC CLEANING WITH CONTROLLED BOUNDARY LAYER THICKNESS AND ASSOCIATED SYSTEMS AND METHODS

CROSS-REFERENCE TO RELATED APPLICATIONS

This application is a divisional of U.S. application Ser. No. 12/944,527 filed Nov. 11, 2010, now U.S. Pat. No. 8,156,950, which is a divisional of U.S. application Ser. No. 11/971,313 filed Jan. 9, 2008, now abandoned each of which is incorporated herein by reference in its entirety.

TECHNICAL FIELD

The present disclosure is related to megasonic cleaning systems and methods of communicating sonic pressure waves to a microelectronic substrate.

BACKGROUND

Microelectronic substrates are exposed to a variety of physical, thermal, and chemical processes during the manufacture of a microelectronic device. For example, sputter deposition tools can deposit films on a substrate, high-temperature furnaces can grow films on the substrate, and chemical etching equipment can pattern films. All of these processes can leave a variety of residues and particles on the surface of a substrate, which, if not removed, can contaminate the substrate surface and deleteriously impact the performance of a microelectronic device. For example, conductive contaminates at the substrate surface can electrically short together two or more regions of an electrical element (e.g., a transistor, resistor, or capacitor) such that the electrical element does not function properly. In fact, the failure of this one element can in turn affect other electrical elements and ultimately disable or corrupt the entire microelectronic device. To mitigate effects such as these, microelectronic manufacturing processes implement a variety of cleaning processes that can remove surface contaminants.

One cleaning process in particular uses sonic pressure waves to remove particles from a substrate surface. This cleaning process typically involves submerging a substrate in a liquid and using the pressure waves to induce cavitation events proximate the substrate surface. These events can impart cavitation energy to particles attached to the surface that can remove or detach the particles. Depending on the type of sonic frequencies employed, this type of process can be referred to as an ultrasonic clean (having frequencies greater than 20 KHz but generally less than 800 KHz) or a megasonic clean (having frequencies of about 800 KHz or greater).

In general, megasonic cleaning processes typically impart less cavitation energy than ultrasonic cleaning processes. Consequently, ultrasonic cleaning processes typically remove more particles than megasonic cleaning processes, but ultrasonic cleaning processes typically induce more damage to the features of a substrate (e.g., patterned oxide, polysilicon, and metal). As microelectronic devices are manufactured to be smaller and more compact, they include smaller and more delicate features. Accordingly, the substrates that carry these devices are more likely to be cleaned with a megasonic cleaning process. Unfortunately, however, the lower cavitation energies of megasonic cleaning processes may not sufficiently remove surface particles.

BRIEF DESCRIPTION OF THE DRAWINGS

FIG. 4 is a cross-sectional side view of a system for cleaning a microelectronic substrate configured in accordance with another embodiment of the disclosure.

FIG. 5 is a cross-sectional side view of a system for cleaning a microelectronic substrate configured in accordance with another embodiment of the disclosure.

DETAILED DESCRIPTION

Various embodiments of megasonic cleaning systems and methods of using megasonic pressure waves to impart cavitation energy proximate a surface of a microelectronic substrate are described below. The term "megasonic" can encompass various propagation frequencies of a sonic wave in a liquid medium, such as propagation frequencies at or above 800 KHz. The term "cavitation energy" can be associated with a variety of cavitation events and phenomena, such as any of those associated with ultrasonic and megasonic cleaning processes. The term "surface" can encompass planar and nonplanar surfaces, either with or without patterned and nonpatterned features, of a microelectronic substrate. Such a substrate can include one or more conductive and/or nonconductive layers (e.g., metallic, semiconductive, and/or dielectric materials) that are situated upon or within one another. These conductive and/or nonconductive layers can also contain a myriad of electrical elements, mechanical elements, and/or systems of such elements in the conductive and/or nonconductive layers (e.g., an integrated circuit, a memory, a processor, a microelectromechanical system (MEMS), etc.). Other embodiments of megasonic cleaning systems or methods of megasonic cleaning in addition to or in lieu of the embodiments described in this section may have several additional features or may not include many of the features shown and described below with reference to FIGS. 1-6.

Figures 1, 2:
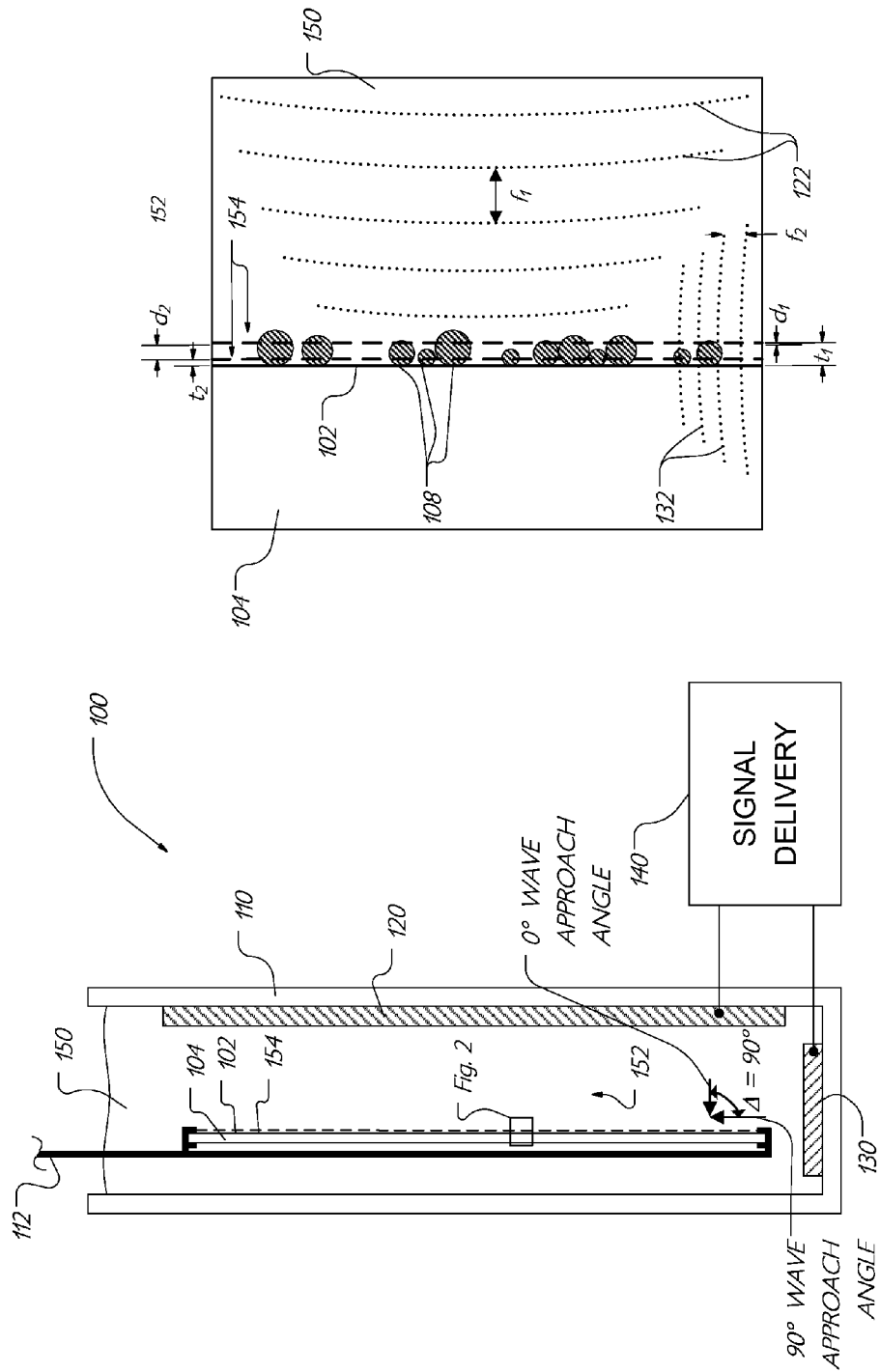
FIG. 1 is a cross-sectional side view of a system for cleaning a microelectronic substrate configured in accordance with an embodiment of the disclosure.
FIG. 2 is a blow-up, partial cross-sectional side view of the substrate of FIG. 1 during a megasonic cleaning process.

FIG. 1 is a cross-sectional side view of an embodiment of a system 100 for cleaning a surface 102 of a microelectronic substrate 104. The system 100 includes a process tank or vessel 110, first and second transducers 120 and 130 disposed within the tank 110, and a signal delivery component 140 operably coupled with the first and second transducers 120 and 130. The process tank 110 can be filled with a liquid 150 and can include a support element 112 for carrying the microelectronic substrate 104. The first and second transducers 120 and 130 are positioned within the process tank 110 to deliver sonic pressure waves through the liquid 150 to the substrate surface 102. For example, the first and second transducers 120 and 130 can include piezoelectric or other mechanical elements that can be electrically driven and oscillated. In many embodiments, the signal delivery component 140 (described further with reference to FIG. 6) (a) drives the first transducer 120 to induce cavitation events in a bulk portion 152 of the liquid 150 and (b) drives the second transducer 130 to adjust the thickness of a boundary or transition layer 154 in the liquid 150. As will be described in more detail below, adjusting the boundary layer 154 can bring cavitation events and related phenomena in the bulk liquid portion 152 closer to the particles attached to the substrate surface 102.

In general, cavitation events in the bulk liquid portion can involve the creation and subsequent collapse of microscopic bubbles. The microscopic bubbles form when a low-pressure portion of a sonic wave brings the bulk liquid portion into tension and the amplitude of the sonic wave exceeds the local tensile strength of the liquid. During a first phase of this sonic wave, the bubble grows to a certain size. During a second phase of this sonic wave, the bubble can partially collapse or completely implode. This collapse or implosion event can impart energy to a surface particle at the substrate, which can detach the particle from the substrate. In many examples, acoustic streaming (unidirectional motion attributed to attenuation or absorption within a liquid) can then transport these detached particles away from the surface of a substrate. Other theories of sonic cleaning also postulate that at certain megasonic frequencies, cavitation events and phenomena may include additional or alternative cleaning mechanisms, such as microcavitation (very small cavitation bubbles) and microstreaming (localized acoustic streams near gas bubbles or cavitation bubbles in the liquid). Without being bound to a particular theory regarding such cavitation events and phenomena, the cavitation energy imparted to a particle is typically inversely proportional with the frequency of a sonic wave. Thus, in general, the cleaning efficacy of a sonic wave is likewise inversely proportional with sonic frequency.

However, in contrast to the system 100, the cleaning efficacy of conventional megasonic systems is limited by the boundary layer at the substrate surface. The boundary layer is a thin layer of slow-moving fluid produced by fluid friction with the substrate, and it can effectively shield the substrate surface from the removal forces and energy associated with cavitation events. The size or thickness of this boundary layer depends on the properties of a liquid (e.g., density, viscosity, and kinematics), the energy of a sonic wave, and, in particular, the frequency of the sonic wave. Increasing sonic frequency typically decreases the boundary layer thickness. For example, sonic waves at a frequency of about 40 KHz have a boundary layer thickness of about 40 μm, whereas sonic waves at a frequency of about 900 KHz have a boundary layer thickness of about 2.82 μm. Although increasing the frequency of a sonic wave decreases boundary layer thickness, this shielding problem with the boundary layer cannot be easily mitigated by simply increasing sonic frequency. As described above, cavitation energy is also inversely proportional with sonic frequency, and thus decreasing the frequency of a sonic wave not only decreases the size of a boundary layer but also decreases cleaning efficacy.

Embodiments of the system 100, however, overcome this tradeoff between boundary layer thickness and cavitation energy by impinging two separate sonic waves on the surface of a substrate. One of the sonic waves imparts cavitation energy to the substrate surface, and the other sonic wave regulates or controls the thickness of the boundary layer. Both of these sonic waves propagate towards the substrate surface, but impinge on the surface from different approach angles. In several embodiments this may be achieved by positioning the first transducer 120 so that it is askew and/or non-coplanar with the second transducer 130. For example, in the embodiment of FIG. 1, the first transducer 120 is generally perpendicular with the second transducer 130 such that the first transducer 120 has a wave approach angle of about 0 degrees with respect to the substrate surface 102 and the second transducer 130 has a wave approach angle of about 90 degrees with respect to the substrate surface 102. In addition, as will be described in more detail below, boundary layer regulation also requires operating the second transducer 130 at a frequency that is higher than the frequency of the first transducer 120.

FIG. 2 is a blow-up, partial cross-sectional side view of the substrate 104 showing individual particles 108 being removed from the substrate surface 102 via first sonic waves 122 produced by the first transducer 120 (FIG. 1) and second sonic waves 132 produced by the second transducer 130 (FIG. 1). The first sonic waves 122 have a frequency $f_1$ and induce cavitation events in the bulk liquid portion 152. The second sonic waves 132 have a frequency $f_2$ and are concurrently communicated with the first sonic waves 122 to the substrate surface 102. In the example of FIG. 2, the frequency $f_2$ of the second sonic waves 132 is greater than the frequency $f_1$ of the first sonic waves 122, which lowers the thickness of the boundary layer 154 from a first thickness $t_1$ to a second thickness $t_2$. At the first thickness $t_1$, the individual particles 108 project an average distance $d_1$ beyond the boundary layer 154. However, at the second (regulated) thickness $t_2$, the individual particles 108 have a larger projection distance $d_2$, which increases the exposure of the individual particles 108 to the bulk liquid portion 152. This in turn decreases the likelihood that the boundary layer 154 will shield the individual particles 108 from cavitation events and increases the likelihood that cavitation energy will detach the particles from the substrate surface 102. In other examples, the second sonic waves 132 can also create cavitation events; however, the cavitation energy of these events is generally less substantial than the energy associated with the cavitation events produced by the first sonic waves 122. Thus, in many examples, the second sonic waves 132 primarily regulate the boundary layer 154 and do not impart cavitation energy to the particles 108. In additional or alternative embodiments, cleaning action is also enhanced by acoustic streaming. For example, the first and/or second sonic waves 122 and 132 can create localized and unidirectional streams (not shown) in the liquid 150 that transport the individual particles 108 away from the substrate surface 102.

Figure 3:
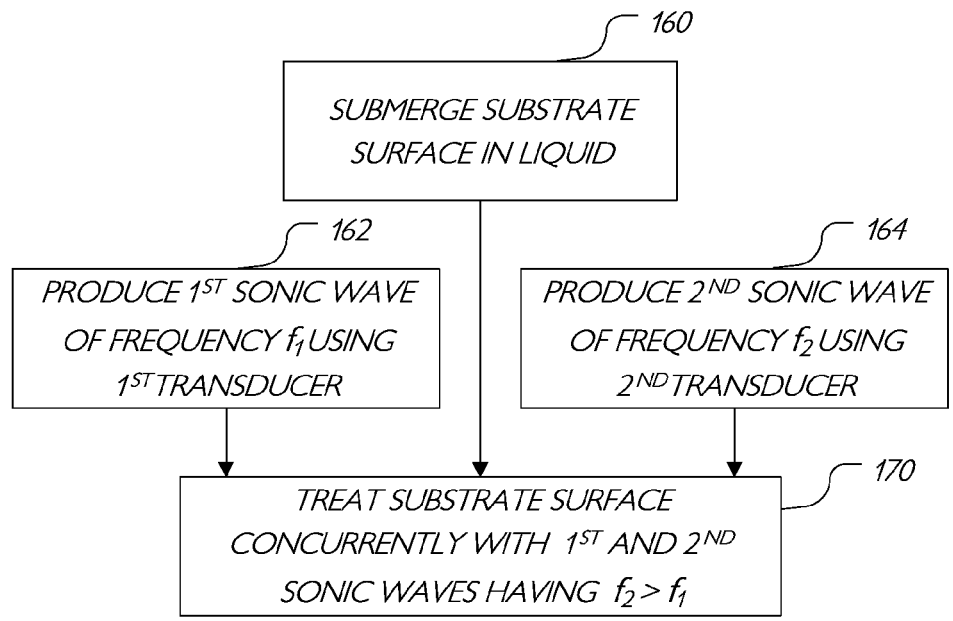
FIG. 3 is a flow diagram of an embodiment of a megasonic cleaning process.

FIG. 3 is a flow diagram showing an embodiment of a megasonic cleaning process that may be carried out using a megasonic cleaning system, such as the system 100 (FIG. 1). The cleaning process includes at least partially submerging a substrate surface in a liquid (block 160), producing sonic waves of a first frequency $f_1$ in the liquid using a first transducer (block 162), and producing second sonic waves of a second frequency $f_2$ in the liquid using a second transducer (block 164) that is askew or non-coplanar with the first transducer. The cleaning process also includes treating the substrate surface concurrently with the first and second sonic waves by having the second frequency $f_2$ be larger than the first frequency $f_1$ (block 170). The sonic waves of the first frequency $f_1$ can control the cavitation energy in the liquid, and the sonic waves of the second frequency $f_2$ can regulate the thickness of the boundary layer, influencing the extent to which cavitation forces are applied at a substrate surface. In several examples, the first frequency $f_1$ can be in a range of about 1-3 MHz and the second frequency $f_2$ can be in a range of about 2-5 MHz.

In many embodiments, the multifrequency process of FIG. 3 can be used in lieu of a single-frequency, conventional megasonic cleaning process. For example, a single-frequency process at 1 MHz may have substantial cleaning efficacy but may also induce damage at a substrate surface. However, a comparable cleaning efficacy may be achieved with no induced damage (or less induced damage) by substituting the 1 MHz sonic wave with two higher-frequency sonic waves. For example, a first sonic wave may have a first frequency $f_1$ of about 2 MHz and a second sonic wave may have a second frequency $f_2$ of about 5 MHz. Each of these sonic waves if applied without the other would have less cleaning efficacy than the 1 MHz single-frequency process. However, in many embodiments, the multifrequency process achieves the same (or greater) cleaning efficacy of the single frequency process. For example, by regulating the boundary layer thickness with the 5 MHz sonic wave, the boundary layer shields less particles than the 1 MHz sonic wave. Accordingly, with the regulated boundary layer, the 2 MHz sonic wave can impinge more cavitation energy on surface particles, despite producing lower energy or fewer cavitation events than the 1 MHz sonic wave.

FIG. 4 is a cross-sectional side view of another embodiment of a megasonic cleaning system 200 that includes the process tank 110, the signal delivery component 140, and first and second transducers 220 and 230 disposed at opposing sides of the tank. Similar to the system 100, the first transducer 220 can induce cavitation events in the bulk portion 152 of the liquid 150, and the second transducer 230 can control the boundary layer 154. However, in contrast to the system 100, the wave approach angle of the first transducer 220 is at about 0 degrees with respect to the substrate surface 102, and the wave approach angle of the second transducer 230 is at about 180 degrees with respect to the substrate surface 102. Accordingly, the first transducer 220 communicates sonic signals to the substrate surface 102 through the liquid 150 and the second transducer 230 communicates sonic signals to the substrate surface 102 through the liquid 150 and a bulk portion of the substrate 104. In addition, in many embodiments, a distance $d_3$ between the substrate 104 and the second transducer 230 can be increased or decreased to enhance or diminish the influence of the second transducer 230 on the boundary layer 154. Decreasing the distance $d_3$, for example, can reduce sonic wave attenuation in the liquid 150 and thus increase the overall efficiency of wave propagation from the second transducer 230 to the substrate surface 102. In other embodiments, the support element 112 can be adjusted in situ to bring the substrate 104 more or less proximate with the second transducer 230. For example, the boundary layer in such an in situ process can expand and contract at a periodic frequency, which may assist particle removal by mechanically agitating particles attached to the substrate surface 102.

FIG. 5 is a cross-sectional side view of another embodiment of a megasonic cleaning system 300 that employs transducers that can clean localized portions of a substrate surface or clean an entire substrate surface. The system 300 includes the process tank 110, the signal delivery component 140, a support arm 314, and first and second transducers 320 and 330 perpendicular to one another and disposed on the arm 314. In the example of FIG. 5, the arm 314 can scan the first and second transducers 320 and 330 across the substrate surface 102, or a localized zone of the surface. When oscillating, the first and second transducers 320 and 330 create sonic fields that induce cavitation events in a bulk liquid portion 352 and create a boundary layer 354. The bulk liquid portion 352 and the boundary layer 354 produce a cleaning zone 356 that accordingly moves with the arm 314 as it scans across the substrate 104. In general, the cleaning zone 356 is substantially smaller in area than the substrate surface 102, and the arm 314 moves the cleaning zone 356 across the substrate surface 102 to clean the entire surface, or a localized zone on the surface. In alternative embodiments, the arm 314 can be omitted, the first and second transducers 320 and 330 can be affixed to the process tank 110, and the support element 112 can move the substrate 104 across the first and second transducers 320 and 330.

Embodiments of megasonic cleaning systems can also have other arrangements of transducers and/or can include additional transducers. For example, the system 100 (FIG. 1) can include an array of the first transducers 120 and/or an array of the second transducers 130. Additionally or alternatively, embodiments of transducer arrangements can include transducers positioned at a variety of angles with respect to one another, including those that are less than or greater than 90 degrees. Also, transducers can be operated at a variety of frequencies to generally increase or decrease the thickness of the boundary layer and accordingly decrease or increase the proximity of a bulk liquid with a substrate surface. For example, in several embodiments, the signal delivery component can perform frequency sweeps across a first frequency range via one transducer and frequency sweeps across a second frequency range via another transducer. Furthermore, although the foregoing embodiments have been described in the context of single-wafer processing systems, other embodiments may be adapted to clean multiple wafers or batches of such wafers, including wafers that are supported in a process tank via a cassette or boat.

Figure 6:
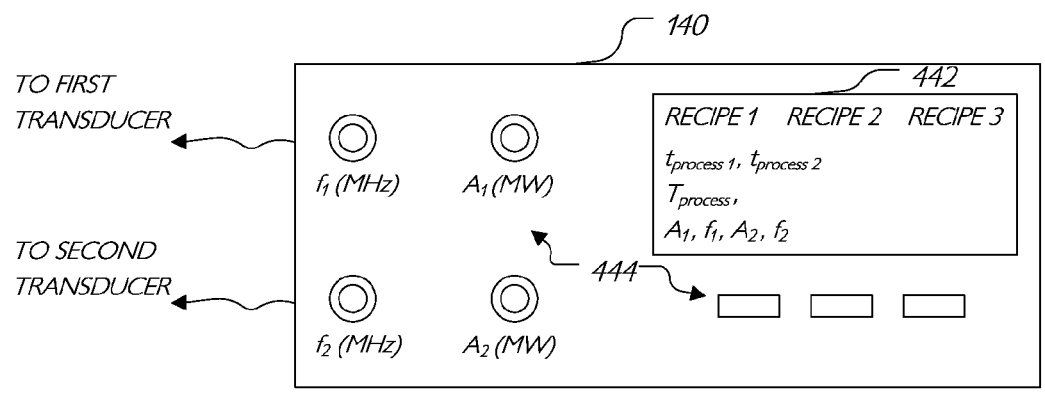
FIG. 6 is a schematic diagram of a signal delivery component that can drive transducers during a megasonic cleaning process.

FIG. 6 is a schematic diagram showing in greater detail the signal delivery component 140, which can be employed in any of foregoing megasonic cleaning systems or in other embodiments of cleaning systems. In general, the signal delivery component 140 supplies a variety of time-varying electrical currents or potentials to the transducers, oscillating the transducers and producing sonic waves in the liquid 150. In the example of FIG. 6, the signal delivery component 140 can include a display 442 for displaying processing parameters and manual controls 444 for adjusting the frequency (f) and/or amplitude (A) or power of a sonic wave. The manual controls 444 can also be used to adjust a process time ($t_{process}$) and/or liquid temperature ($T_{process}$) of a megasonic cleaning system. In several embodiments, the signal delivery component 440 includes a processing unit and a memory storing programmed process recipes. For example, the programmed recipes can automatically dial in processing parameters for a specific type of megasonic clean (e.g., a pre-diffusion clean or a post-chemical mechanical polish (CMP) clean). Additionally or alternatively, such recipes can also cause the signal delivery component 140 to automatically or semi-automatically operate a transducer, the support element 112, or other mechanical components (e.g., a pump, a valve, etc.). For example, in some embodiments, the signal delivery component 140 can control the movement of the support arm 314 (FIG. 5).

Embodiments of megasonic cleaning systems can also include additional features and components. For example, in many embodiments, the process tank 110 includes additional components, such as a heating element for heating the liquid 150, a thermocouple for regulating liquid temperature, and/or other mechanical elements (e.g., a drain, a lid, a filter, and/or an outer tank weir). Also, depending on the type of cleaning process carried out by a megasonic cleaning system, the liquid 150 can include a variety of chemistries. For example, the liquid 150 can be deionized water and can optionally include dilute concentrations of hydrogen peroxide ($H_2O_2$) and/or ammonium hydroxide ($NH_4OH$). In other embodiments, the liquid 150 can include other chemistries, such as other types of acidic or basic solutions. For example, the liquid 150 can be a dilute hydrofluoric acid that works in combination with the first and second sonic waves 122 and 132 (FIG. 2) to remove organic residues from the substrate surface 102.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is inclusive and is used throughout to mean including at least the recited feature(s) such that any greater number of the same feature and/or additional types of other features are not precluded. It will also be appreciated that specific embodiments of the invention have been described herein for purposes of illustration, but that various modifications may be made without deviating from the inventions. For example, many of the elements of one embodiment can be combined with other embodiments in addition to, or in lieu of, the elements of the other embodiments. Accordingly, the invention is not limited except as by the appended claims.

I claim:

1. A cleaning method, comprising:
   immersing a substrate in a liquid contained in a process tank;
   operating a first transducer to communicate first sonic waves to a surface portion of the substrate, the first sonic waves having a first frequency and a first wave approach angle relative to the surface of the substrate, wherein the first sonic waves produce a boundary layer region in the liquid adjacent the surface portion of the substrate; and
   operating a second transducer to adjust a width of the boundary layer region by communicating second sonic waves to the surface portion of the substrate at a second wave approach angle relative to the surface of the substrate, the second sonic waves being concurrently communicated to the surface portion with the first sonic waves and having a second frequency that is greater than the first frequency of the first sonic waves,
   wherein
      the first and second transducers are disposed within the process tank, and
      the first and second wave approach angles have a difference of 180 degrees.

2. The method of claim 1 wherein the second sonic waves are communicated through the substrate en route to the surface portion of the substrate.

3. The method of claim 1, further comprising increasing the second frequency of the second sonic waves to decrease the width of the boundary layer region.

4. The method of claim 1, further comprising decreasing the second frequency of the second sonic waves to increase the width of the boundary layer region.

5. A method for cleaning a microelectronic substrate, the method comprising:
   at least partially submerging the substrate in a liquid-phase fluid contained in a vessel, the substrate including a surface having particles attached to the surface;
   imparting first sonic waves having a first frequency to the substrate via a first transducer within the vessel and in fluid communication with the substrate, the first sonic waves having a first wave approach angle relative to the surface of the substrate; and
   removing the particles from the substrate by imparting second sonic waves having a second frequency to the substrate via a second transducer within the vessel and in fluid communication with the substrate, the second transducer facing the first transducer at an opposite side of the substrate, the second frequency being greater than the first frequency, and the second sonic waves being concurrently imparted with the first sonic waves and having a second wave approach angle relative to the surface of the substrate, the first and second wave approach angles having a difference of 180 degrees.

6. The method of claim 5 wherein the first sonic waves induce cavitation events of a first energy in the fluid and the second sonic waves cavitation events of a second energy in the fluid, the first energy being greater than the second energy.

7. The method of claim 5 wherein removing the particles from the substrate further comprises while concurrently imparting the first and second sonic waves, moving the substrate toward the second transducer and away from the first transducer.

8. The method of claim 5 wherein removing the particles from the substrate further comprises while concurrently imparting the first and second sonic waves, moving the substrate toward the first transducer and away from the second transducer.

9. A method for cleaning a microelectronic substrate, the method comprising:
   submerging a substrate in a liquid contained within a process tank;
   operating a first transducer at a first frequency to produce a first sonic field in the liquid, wherein the first transducer initiates cavitation events in a bulk portion of the liquid proximate a surface of the substrate via the first sonic field; and
   operating a second transducer at a second frequency greater than the first frequency to produce a second sonic field in the liquid that regulates a thickness of a boundary layer in the liquid, wherein the second sonic field controls an interface of fluid friction between the substrate and the bulk portion of the liquid by regulating the thickness of the boundary layer,
   wherein
      the first and second transducers are in the process tank and disposed at opposite sides of the substrate such that the first and second transducers are directed toward one another,
      the first sonic field has a first wave approach angle relative to the surface of the substrate,
      the second sonic field has a second wave approach angle relative to the surface of the substrate, and
      the first and second wave approach angles have a difference of 180 degrees.

10. The method of claim 9 wherein the first and second transducers face each other such that they are aligned with one another across the substrate.

* * * * *